United States Patent [19]

Nakamura

[11] Patent Number: 5,761,074
[45] Date of Patent: Jun. 2, 1998

[54] FREQUENCY DATA CONVERTER AND METER APPARATUS

[75] Inventor: Yoshihito Nakamura, Sagamihara, Japan

[73] Assignee: Kabushiki Kaisha Toshiba, Kawasaki, Japan

[21] Appl. No.: 915,593

[22] Filed: Aug. 21, 1997

Related U.S. Application Data

[63] Continuation of Ser. No. 395,312, Feb. 28, 1995, abandoned.

[30] Foreign Application Priority Data

Feb. 28, 1994 [JP] Japan ............................ 6-029193

[51] Int. Cl.⁶ ................ G01P 3/48; G01P 3/481; G01P 3/489; G01R 11/36
[52] U.S. Cl. .......... 364/484; 364/565; 364/572; 364/724.06; 364/734; 364/76.44; 364/166; 364/143
[58] Field of Search ............ 364/484, 565, 364/572, 724.011, 575, 724.06; 327/102, 100, 113, 172, 176; 324/76.39, 76.44, 143, 144, 146, 160, 163, 166, 167; 377/42; 341/52, 53, 54, 61, 122, 123

[56] References Cited

U.S. PATENT DOCUMENTS

| | | | |
|---|---|---|---|
| 4,988,944 | 1/1991 | Ito | 324/154 PB |
| 5,017,861 | 5/1991 | Hukuda | 324/143 |
| 5,051,688 | 9/1991 | Murase et al. | 324/143 |
| 5,177,373 | 1/1993 | Nakamura | 307/265 |
| 5,218,291 | 6/1993 | Murase | 324/143 |
| 5,313,155 | 5/1994 | Yamamoto et al. | 324/143 |
| 5,315,536 | 5/1994 | Murase et al. | 364/569 |
| 5,357,196 | 10/1994 | Ito | 324/166 |
| 5,448,163 | 9/1995 | Murase | 324/143 |
| 5,448,508 | 9/1995 | Ono et al. | 364/734 |

FOREIGN PATENT DOCUMENTS

| | | |
|---|---|---|
| 0 509 484 | 10/1992 | European Pat. Off. |
| 40 35 521 | 5/1992 | Germany. |
| 42 25 819 | 2/1993 | Germany. |

*Primary Examiner*—James P. Trammell
*Assistant Examiner*—Tony M. Cole
*Attorney, Agent, or Firm*—Oblon, Spivak, McClelland, Maier & Neustadt, P.C.

[57] ABSTRACT

In one data updating period, an edge pulse signal generator detects an edge of a pulse signal, and generates a one-shot pulse signal. A digital filter performs digital filter processing of the one-shot pulse signal, and outputs one frequency data. An averaging circuit adds k (positive integer) frequency data output from the digital filter in k data updating periods, and calculates average value data as an average value of the k frequency data. Furthermore, the averaging circuit sets a period in which the value of the average value data is held to be a constant value to be k times the data updating period. A PWM conversion circuit converts the average value data into PWM data by pulse-width modulation.

7 Claims, 12 Drawing Sheets

FREQUENCY DATA CONVERTER AND METER APPARATUS

This application is a Continuation of application Ser. No. 08/395,312, filed on Feb. 28, 1995, now abandoned.

BACKGROUND OF THE INVENTION

1. Field of the Invention

The present invention relates to an apparatus which generates a signal for driving a needle of a meter indicating the velocity of a vehicle and the rotational speed of an engine of the vehicle, etc.

2. Description of the Related Art

A speedometer or tachometer of a vehicle is controlled by a frequency data converter. More specifically, the frequency data converter controls the movement of an indicator of the speedometer or tachometer on the basis of velocity data or rotational speed data (a pulse signal of a predetermined frequency).

The frequency data converter has a digital processing circuit to control the movement of the indicator of the speedometer or tachometer on the basis of velocity data or rotational speed data.

Japanese Patent Application No. 5-281277 discloses an example of the digital processing circuit. The digital processing circuit comprises a pulse counter for detecting the number of pulses of input data (velocity data or rotational speed data), an edge pulse signal generator for generating an edge pulse signal upon reception of data output from the pulse counter, and a digital integration circuit for digitally performing integration using an adder/subtracter on the basis of the edge pulse signal.

Figure 1:
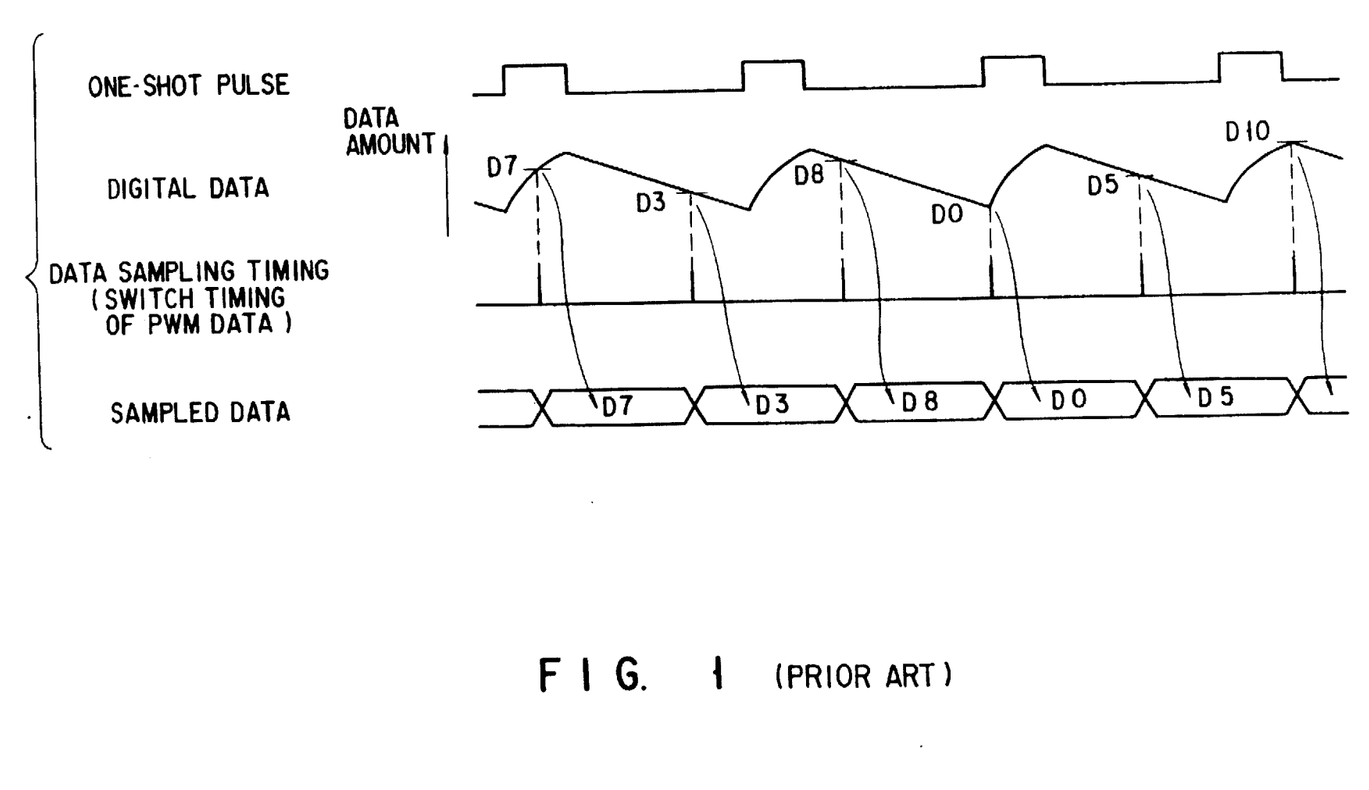
FIG. 1 is a waveform chart showing the operation of a conventional digital processing circuit.

Conventionally, as shown in FIG. 1, when output data (digital data) of the digital processing circuit is sampled, the sampled output data is converted into PWM (pulse width modulated) data, and the PWM data is supplied to a coil of a motor for driving a meter, the following problems are posed.

The digital integration circuit performs calculations every, e.g., 8 µs, and outputs average value data. In other words, the average value data varies every 8 µs. Therefore, when the average data is converted into PWM data, if the sampling timing of data is adjusted to the conversion timing (the period is, e.g., 8 ms) of the PWM data, a sampling error occurs.

Such sampling error can be prevented by setting the period of the sampling timings to be shorter than that of the conversion timings of the PWM data. For example, upon conversion of digital data into an analog voltage, if a ladder circuit consisting of a plurality of resistors is used, the period of the sampling timings can be set to be shorter than that of the conversion timings of the PWM data.

However, if a CR integration circuit is used upon conversion of digital data into PWM data, the period of the sampling timings becomes longer than that of the conversion timings of PWM data. Therefore, when digital data varies at a period shorter than that of the PWM data, a sampling error and a PWM conversion error occur upon PWM conversion.

On the other hand, in a speedometer, tachometer, or the like for a vehicle, the direction (angle) indicated by the indicator of the meter is determined by 12-bit data.

Japanese Patent Application No. 2-259090 discloses a technique for obtaining PWM data by comparing lower 8-bit data of 12-bit data with the output from an 8-bit binary counter on the basis of a data compression technique.

However, with this technique, a sampling error or a PWM conversion error occurs upon sampling of data.

SUMMARY OF THE INVENTION

The present invention has been made to solve the above-mentioned problems, and has as its object to prevent a sampling error and a conversion error upon sampling of average value data obtained via differential processing and digital filter processing of frequency data (pulse data).

In order to achieve the above object, a frequency data converter of the present invention comprises: a first processing circuit for detecting an edge of a pulse signal, generating a specific one-shot pulse signal, performing digital filter processing of the one-shot pulse signal, and outputting one frequency data, all in one data updating period; and a second processing circuit for adding k (positive integer) frequency data output from the first processing circuit in k data updating periods to obtain average value data as an average value of the k frequency data, and setting a period in which a value of the average value data is held to be a constant value to be k times the data updating period.

The first processing circuit comprises a pulse edge signal generator for detecting the edge of the pulse signal, and generating a specific one-shot pulse signal, and a digital filter for performing digital filter processing of the one-shot pulse signal, and outputting the frequency data.

The converter further comprises a PWM conversion circuit for converting average value data obtained by the second processing circuit into PWM data by pulse-width modulation, and the relationship between a period $T_f$ in which the value of the average value data obtained by the second processing circuit is held to be a constant value, and a period $T_{pwm}$ of the PWM data converted by the PWM conversion circuit is set to satisfy $T_f \geq T_{pwm}$.

A meter apparatus of the present invention comprises: two electromagnetic coils which are arranged in two orthogonal directions; a permanent magnet attached to a rotational shaft perpendicular to the two electromagnetic coils; an analog indicator type meter main body which determines a position of an indicator by controlling rotation of the permanent magnet in correspondence with a vector sum of magnetic fields generated by currents which flow through the two electromagnetic coils; a first processing circuit for detecting an edge of a pulse signal, generating a specific one-shot pulse signal, performing digital filter processing of the one-shot pulse signal, and outputting one frequency data, all in one data updating period; a second processing circuit for adding k (positive integer) frequency data output from the first processing circuit in k data updating periods to obtain average value data as an average value of the k frequency data, and setting a period in which a value of the average value data is held to be a constant value to be k times the data updating period; a triangular function data conversion circuit for converting the average value data into triangular function data; a PWM conversion circuit for converting the triangular function data output from the triangular function data conversion circuit into PWM data by pulse-width modulation; and a meter driving circuit which has a function of converting the PWM data output from the PWM conversion circuit into a current or voltage, and supplies a current amount corresponding to the PWM data to the two electromagnetic coils.

The first processing circuit comprises a pulse edge signal generator for detecting the edge of the pulse signal, and generating a specific one-shot pulse signal, and a digital filter for performing digital filter processing of the one-shot pulse signal, and outputting the frequency data.

The apparatus further comprises a PWM conversion circuit for converting average value data obtained by the second processing circuit into PWM data by pulse-width modulation, and the relationship between a period $T_f$ in which the value of the average value data obtained by the second processing circuit is held to be a constant value, and a period $T_{pwm}$ of the PWM data converted by the PWM conversion circuit is set to satisfy $T_f \geq T_{pwm}$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A frequency data converter and a meter apparatus using the same according to the present invention will be described in detail hereinafter with reference to the accompanying drawings.

Figure 2:
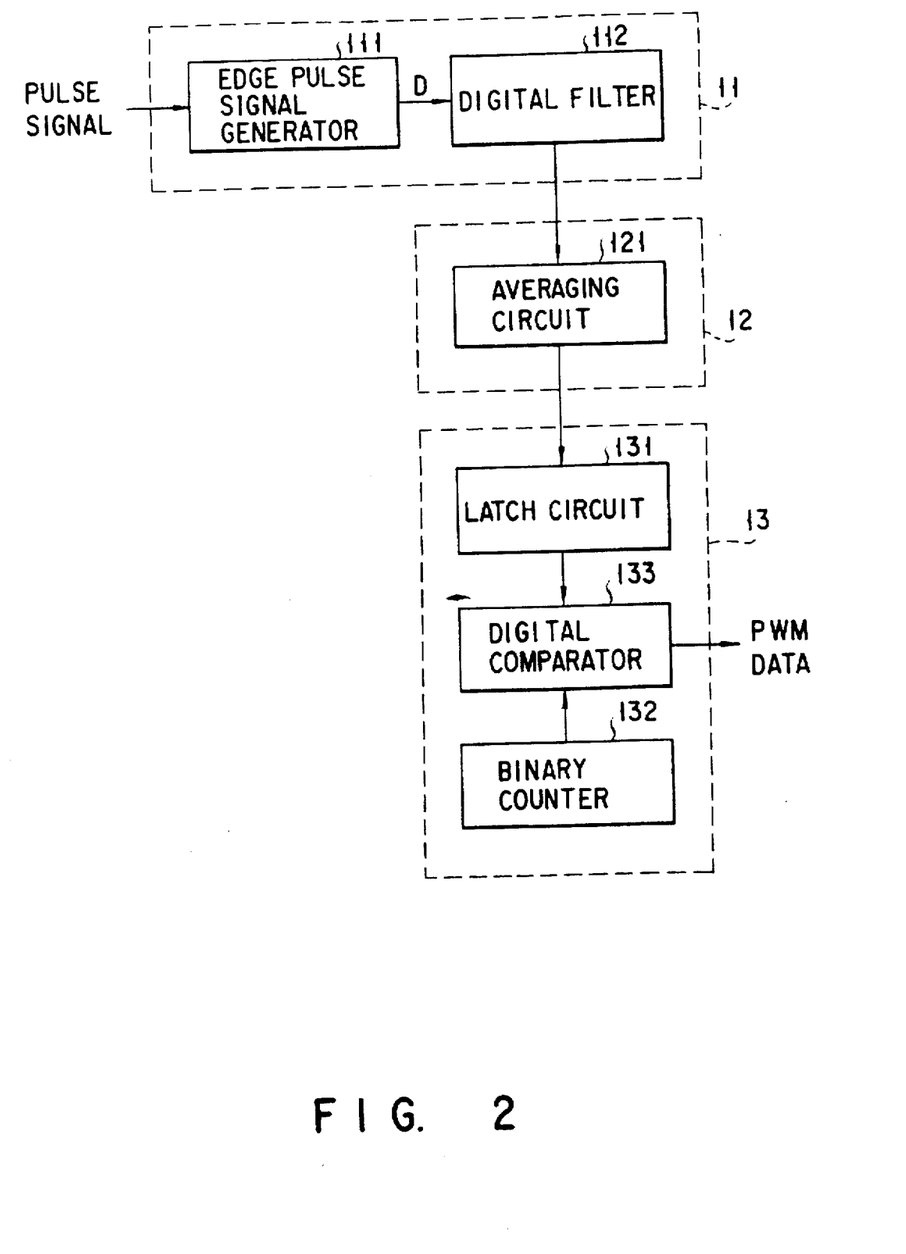
FIG. 2 is a block diagram showing a frequency data converter according to the present invention.
Figure 3:
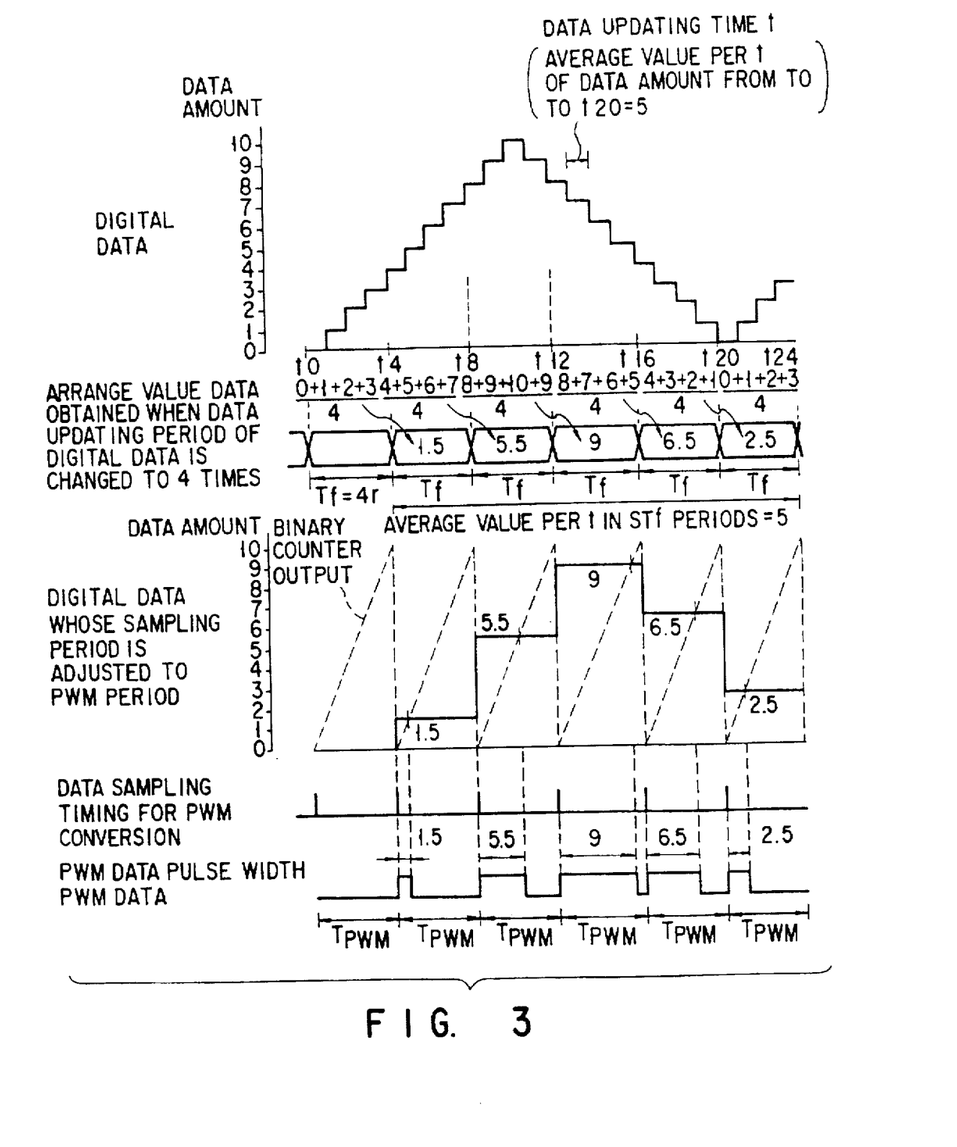
FIG. 3 is a schematic waveform chart showing the operation of an F/V converter shown in FIG. 2.

FIG. 2 shows an F/V converter constituting the frequency data converter of the present invention. FIG. 3 schematically shows the operation of the F/V converter shown in FIG. 2.

In the F/V converter shown in FIG. 2, a first processing circuit 11 comprises an edge pulse signal generator 111 and a digital filter 112. The edge pulse signal generator 111 detects an edge of a pulse signal, and generates a specific one-shot pulse signal. The digital filter 112 executes digital filter processing of the one-shot pulse signal.

The digital filter 112 comprises a digital integration circuit for executing digital integration using an adder/subtracter in correspondence with the edge pulse signal.

A second processing circuit 12 comprises an averaging circuit 121. The averaging circuit 121 prolongs the updating time of frequency data when it calculates average value data of frequency data obtained by the first processing circuit 11.

As shown in FIG. 3, when the average value, for a 20t period, of data D (updating time t) before averaging processing is 5, the average value, for $5T_f$ periods, of average value data (updating time $T_f$) after averaging processing units of 4t periods is also 5.

A PWM conversion circuit 13 converts the average value data obtained by the second processing circuit 12 into PWM (pulse width modulated) data. The relationship between the updating time $T_f$ of the average data obtained by the second processing circuit 12 and a period $T_{pwm}$ of PWM data converted by the PWM conversion circuit 13 is set to satisfy $T_f \geq T_{pwm}$.

The PWM conversion circuit 13 comprises a latch circuit 131 for latching (sampling) average value data (N-bit digital data), a binary counter 132 for outputting N-bit binary data which cyclically changes, and a digital comparator 133 for comparing the latch data and binary data, and outputting PWM data having a pulse width corresponding to the data amount of digital data.

Note that the processing for converting the average value data into the PWM data can also be realized by a data compression technique after sampling of the average value data.

According to the above-mentioned F/V converter, upon sequential execution of differential processing and digital filter processing of frequency data (pulse signal), even when data is updated every, e.g., 8 μs, neither a sampling error nor a conversion error occur. More specifically, when the frequency data is added k (positive integer) times, and the total value is averaged, the updating time $T_f$ of the average value data can be set to be 8 μs×k.

Therefore, in the data sampling processing or processing for converting average value data into PWM data by the data compression technique in the PWM conversion circuit 13, since the relationship between the updating time $T_f$ of average value data and the period $T_{pwm}$ of PWM data satisfy $T_f \geq T_{pwm}$, neither a sampling error nor a conversion error occur.

Figure 4:
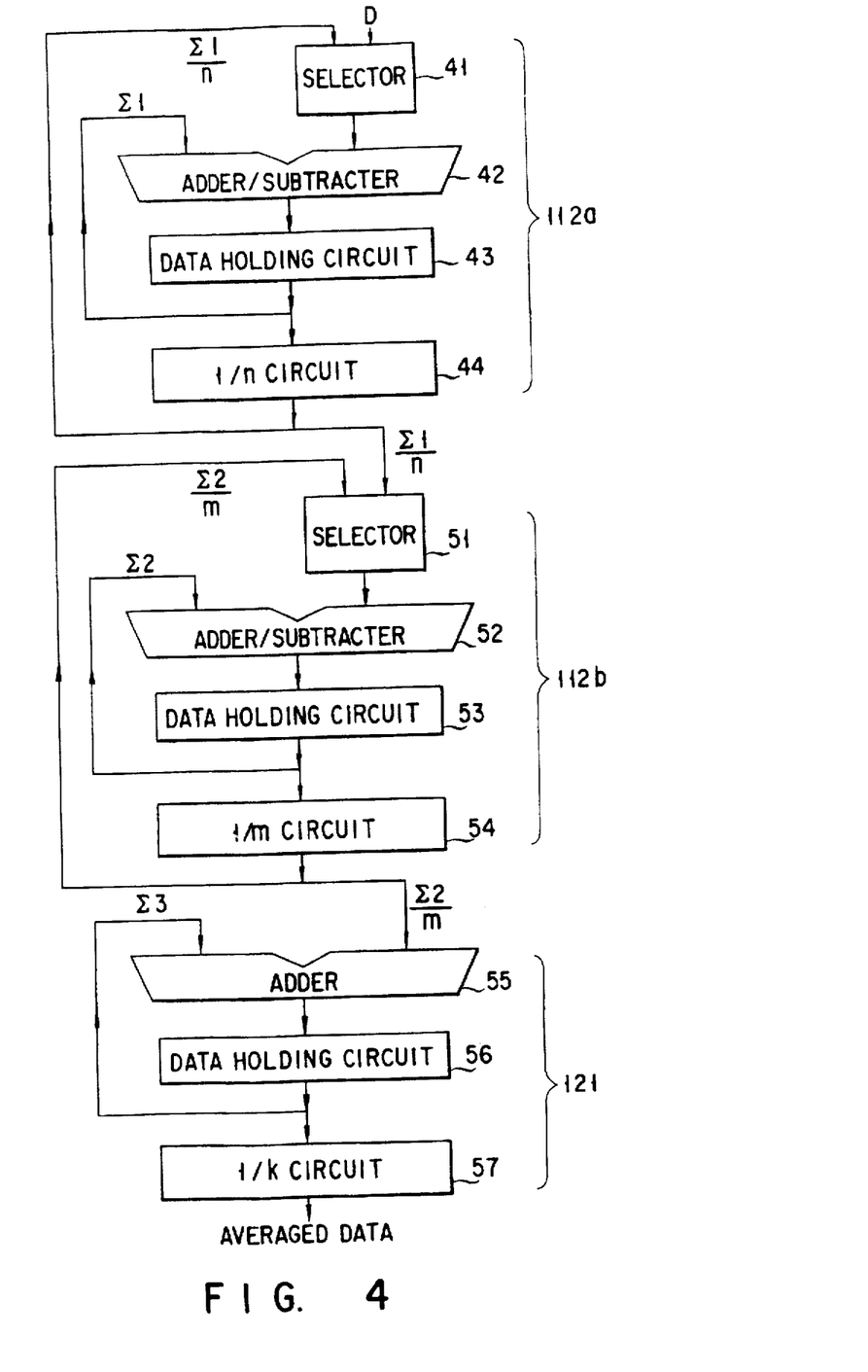
FIG. 4 is a block diagram showing an example of a digital filter and an averaging circuit shown in FIG. 2.
Figure 5:
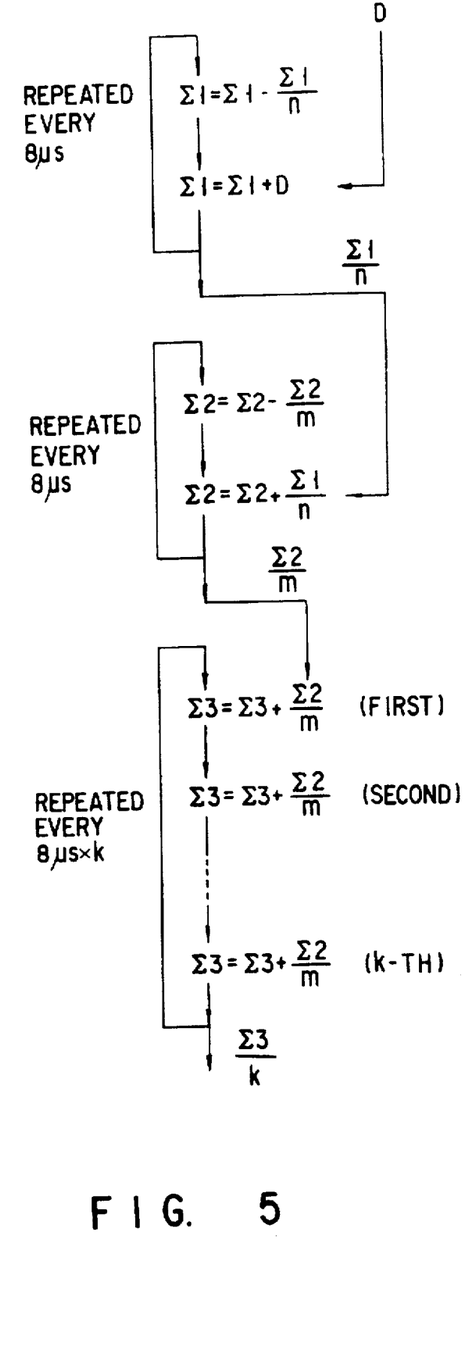
FIG. 5 is a flow chart showing the operation of the circuit shown in FIG. 4.
Figure 6:
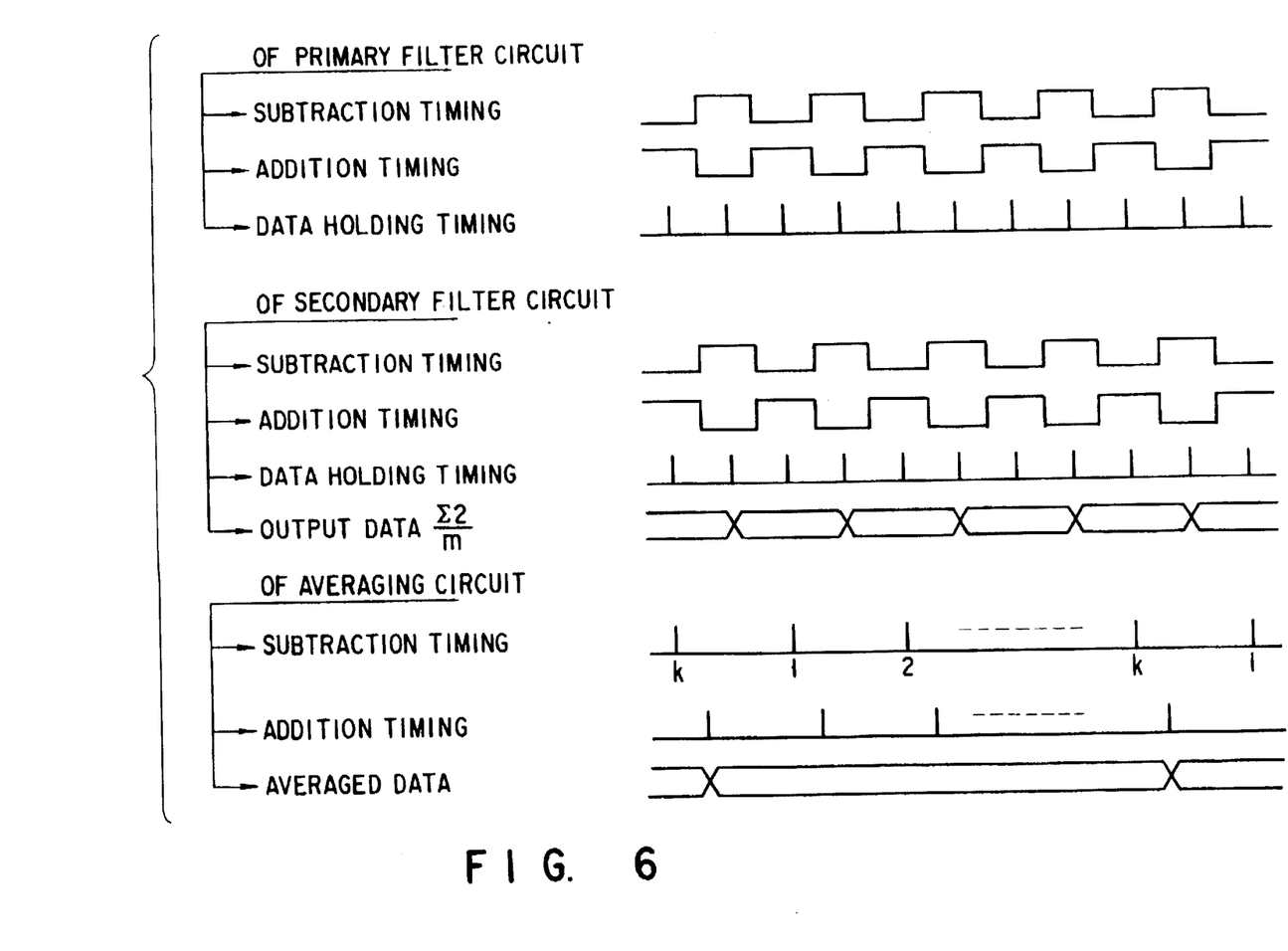
FIG. 6 is a waveform chart showing the operation of the circuit shown in FIG. 4.

FIG. 4 is a block diagram showing an example of the digital filter 112 and the averaging circuit 121 shown in FIG. 2, FIG. 5 is a flow chart showing an operation of the circuit shown in FIG. 4, and FIG. 6 is a waveform chart showing an example of the operation of the circuit shown in FIG. 4.

An integration circuit (primary filter circuit) 112a of the first stage comprises a selector 41, an adder/subtracter 42, a data holding circuit (e.g., a flip-flop circuit) 43, and a 1/n circuit 44 (n is a primary filter constant).

In the primary filter circuit 112a, the selector 41 alternately selects one of an edge pulse signal D and a value 1/n an output Σ1 from the adder/subtracter 42 every 8 μs.

The adder/subtracter 42 adds the edge pulse signal D selected by the selector 41 to Σ1 (data held by the data holding circuit 43), or subtracts a signal with a value of Σ1/n selected by the selector 41 from Σ1.

The data holding circuit 43 holds the output from the adder/subtracter 42. The 1/n circuit 44 supplies a value obtained by multiplying the data Σ1 held by the data holding circuit 43 with 1/n to the selector 41. In this case, if n=$2^N$, the 1/n circuit 44 can be constituted by an N-bit data shift circuit.

An integration circuit (secondary filter circuit) 112b of the second stage comprises a selector 51, an adder/subtracter 52, a data holding circuit 53, and an 1/m circuit 54 (m is a secondary filter constant).

In the secondary filter circuit 112b, the selector 51 alternately selects one of an output signal Σ1/n of the primary filter circuit 112a and a signal with a value 1/m an output Σ2 from the adder/subtracter 52 every 8 μs.

The adder/subtracter 52 adds a signal with a value Σ1/n selected by the selector 51 to Σ2 (data held by the data holding circuit 53), or subtracts a signal with a value Σ2/m selected by selector 51 from Σ2.

The data holding circuit 53 holds the output from the adder/subtracter 52. The 1/m circuit 54 supplies a value obtained by multiplying the data Σ2 held by the data holding circuit 53 with 1/m to the selector 51. In this case, if m=$2^M$, the 1/m circuit 54 can be constituted by an M-bit data shift circuit.

The averaging circuit 121 comprises an adder 55, a data holding circuit 56, and a 1/k circuit 57 (k is the number of times of addition for averaging).

In the averaging circuit 121, the adder adds the output signal Σ2/m from the secondary filter circuit 112b and Σ3 (data held by the data holding circuit 56) every 8 μs. The sum value is held by the data holding circuit 56. This operation is repetitively performed k times.

A signal (average value data) with a value 1/k the data Σ3 held by the data holding circuit 56 is output from the averaging circuit 121 every 8 μs×k. In this case, if k=$2^K$, the 1/k circuit 57 can be constituted by a K-bit data shift circuit.

Assuming that the period of PWM data generated by the PWM conversion circuit 13 is 256 μs, the resolution of the duty is 256, and average value data output from the averaging circuit 121 is updated every 256 μs, the updating time of the signal output from the secondary filter circuit 112b is 8 μs. For this reason, the number k of times of addition for averaging in the averaging circuit 121 can be set to be 32=256 μs/8 μs.

On the other hand, assuming that the period of PWM data generated by the PWM conversion circuit 13 is 8 ms, and average value data output from the averaging circuit 121 is updated every 8 ms, the updating time of the signal output from the secondary filter circuit 112b is 8 μs. For this reason, the number k of times of addition for averaging in the averaging circuit 121 can be set to be 1,000=8 ms/8 μs.

Figure 7:
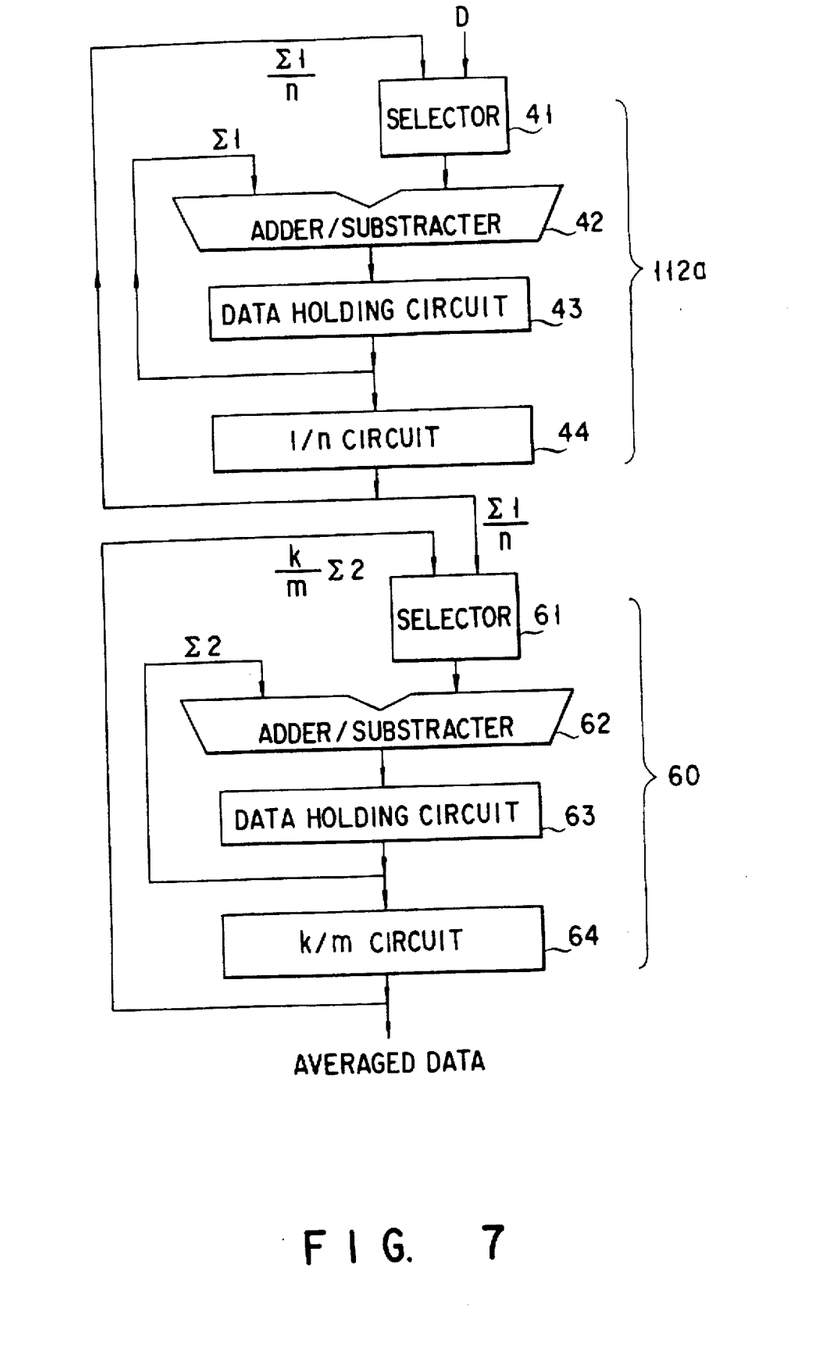
FIG. 7 is a block diagram showing another example of the digital filter and the averaging circuit shown in FIG. 2.
Figure 8:
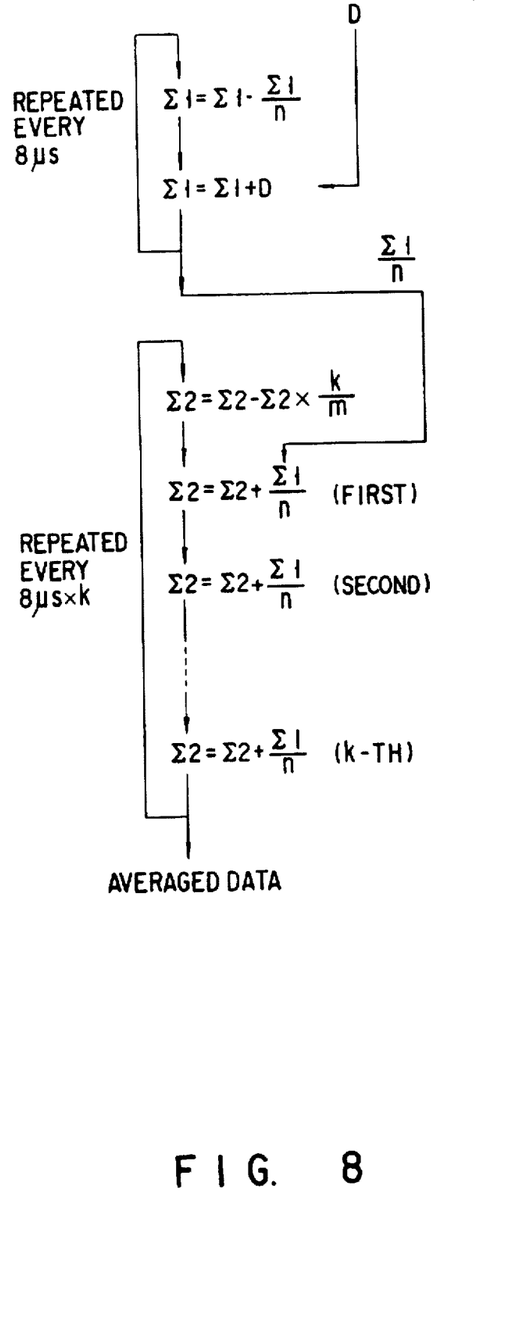
FIG. 8 is a flow chart showing the operation of the circuit shown in FIG. 7.
Figure 9:
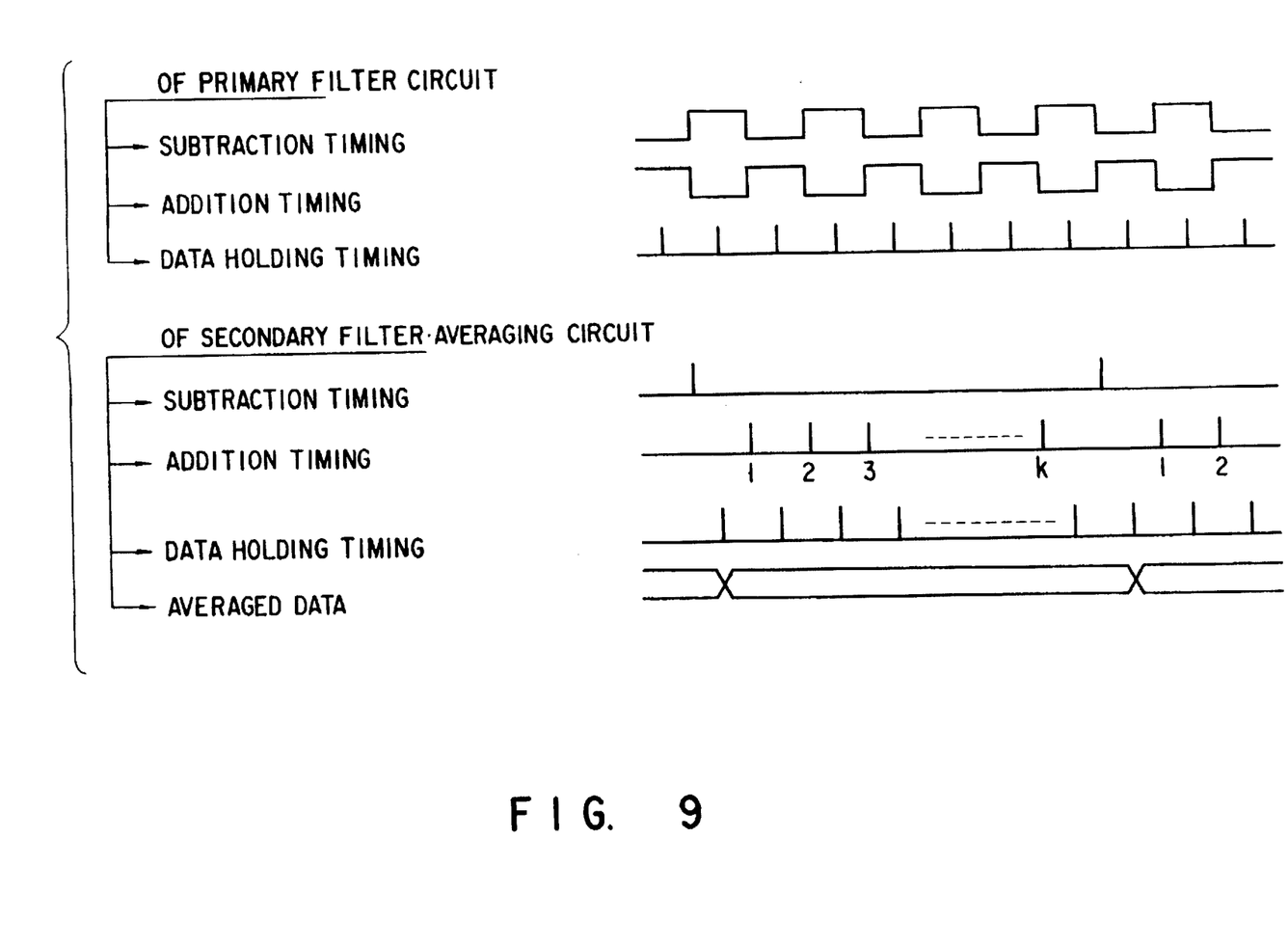
FIG. 9 is a waveform chart showing the operation of the circuit shown in FIG. 7.

FIG. 7 is a block diagram showing another example of the digital filter 112 and the averaging circuit 121 shown in FIG. 2. FIG. 8 is a flow chart showing an example of the operation of the circuit shown in FIG. 7, and FIG. 9 is a waveform chart showing an example of the circuit shown in FIG. 7.

In the circuit shown in FIG. 7, although the arrangement of the primary filter circuit 112a is the same as that in FIG. 4, a secondary filter averaging circuit 60 is adopted in place of the secondary filter circuit 112b and the averaging circuit 121 in FIG. 4, as compared to the circuit shown in FIG. 4.

The secondary filter-averaging circuit 60 comprises a selector 61, an adder/subtracter 62, a data holding circuit 63, and a k/m circuit (m is a secondary filter constant, k is the number of times of addition for averaging) 64.

In the secondary filter averaging circuit 60, the selector 61 alternately selects one of the output signal Σ1/n from the primary filter circuit 112a and a signal with a value k/m of Σ2 (data held by the data holding circuit 63) every 8 μs.

The adder/subtracter 62 repeats, k times, an operation for adding the signal with the value Σ1/n selected by the selector 61 to Σ2 (data held by the data holding circuit 63). Also, the adder/subtracter 62 subtracts the signal with the value k/m of Σ2 selected by selector 61 from the data Σ2 held by the data holding circuit 63 every 8 μs×k.

The data holding circuit 63 holds the output from the adder/subtracter 62. The k/m circuit 64 multiplies the data Σ2 held by the data holding circuit 63 with k/m, and supplies the product to the selector 61. In this case, if m=$2^M$ and k=$2^K$, the k/m circuit 64 can be constituted by an (M−K)-bit data shift circuit.

Figure 10:
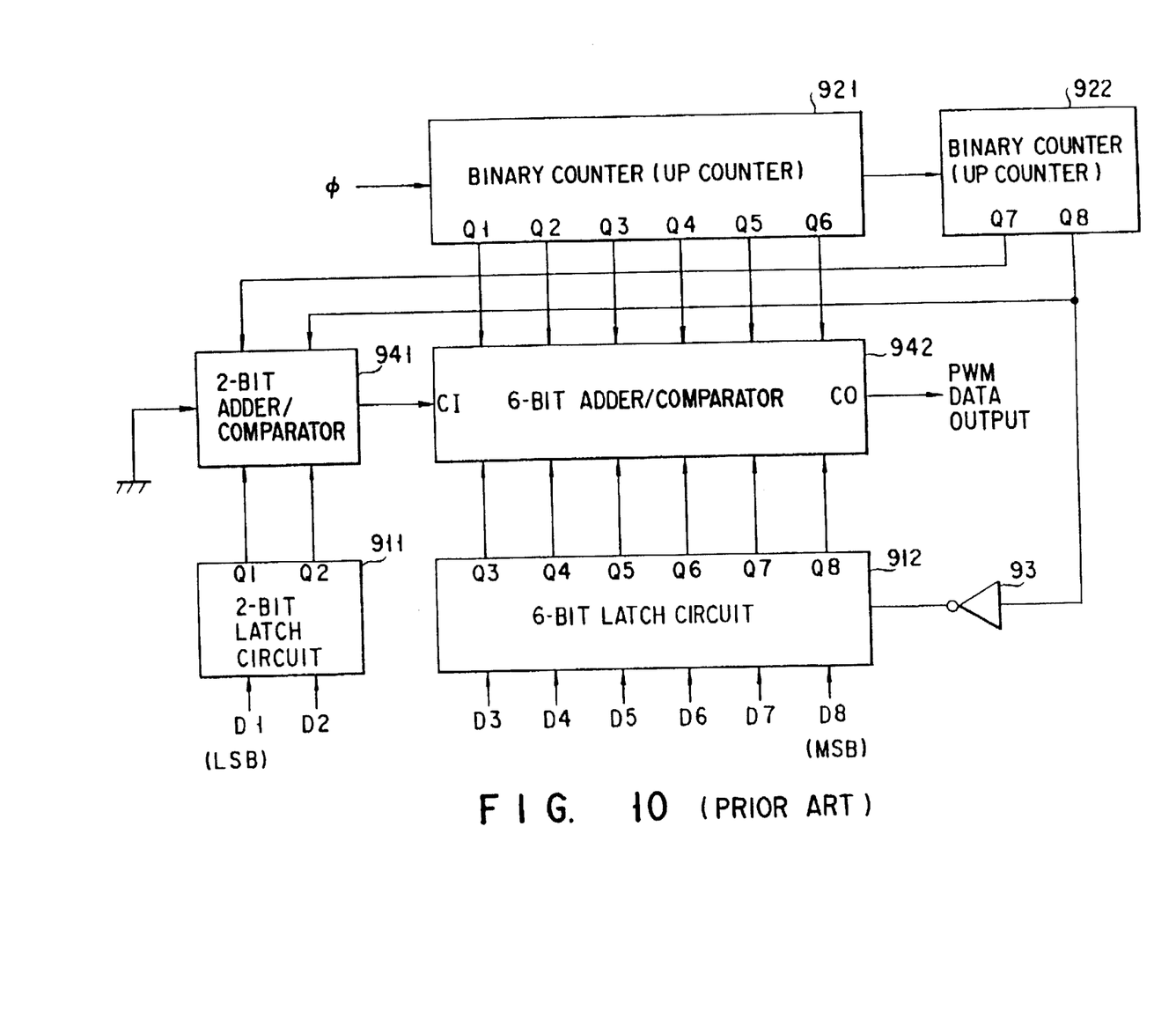
FIG. 10 is a block diagram showing an example of a PWM conversion circuit.

FIG. 10 is a block diagram showing another example of the PWM conversion circuit 13 shown in FIG. 2.

The PWM conversion circuit 13 is a circuit for converting average data into PWM data using a data compression technique disclosed in Japanese Patent Publication No. 2-259090. In the following description, assume that the period of PWM data is 256 μs, and the resolution of the duty is 256.

An 8-bit latch circuit latches 8-bit digital data D1 to D8. The 8-bit latch circuit comprises a 2-bit latch circuit 911 for latching lower 2-bit data D1 and D2, and a 6-bit latch circuit 912 for latching upper 6-bit data D3 to D8.

An 8-bit binary counter counts up clock pulse inputs φ, and outputs 8-bit binary data which cyclically changes. The 8-bit binary counter comprises a binary counter 921 for lower 6 bits, and a binary counter 922 for upper 2 bits.

The MSB of the 8-bit binary counter is input to the 6-bit latch circuit 912 as a latch (sampling) control signal via an inverter 93.

An 8-bit data comparator comprises a 2-bit adder/comparator 941 and a 6-bit adder/comparator 942.

The 2-bit adder/comparator 941 has a function of adding a carry input (data "0") to output data Q1 and Q2 from the 2-bit latch circuit 911. The 2-bit adder/comparator 941 compares sum output data, and the output data from the 2-bit binary counter 922, and outputs PWM data having a pulse width corresponding to the sum output data.

The 6-bit adder/comparator 942 has a function of adding a carry input CI (PWM data output from the 2-bit adder/comparator 941) to output data Q3 to Q8 from the 6-bit latch circuit 912. The 6-bit adder/comparator 942 compares sum output data and the output data from the 6-bit binary counter 921, and outputs PWM data having a pulse width corresponding to the sum output data.

In this case, the period of PWM data output from the 6-bit adder/comparator 942 is determined by the period of the output from the 6-bit binary counter 921. On the other hand, the period of PWM data output from the 6-bit adder/comparator 942 repeats four times while the output from the 2-bit binary counter 922 changes from 1 to 4.

PWM data output from the 2-bit adder/comparator 941 has a pulse width 0 to 3 times the minimum unit (1/64) of the duty of the PWM data.

Figure 11:
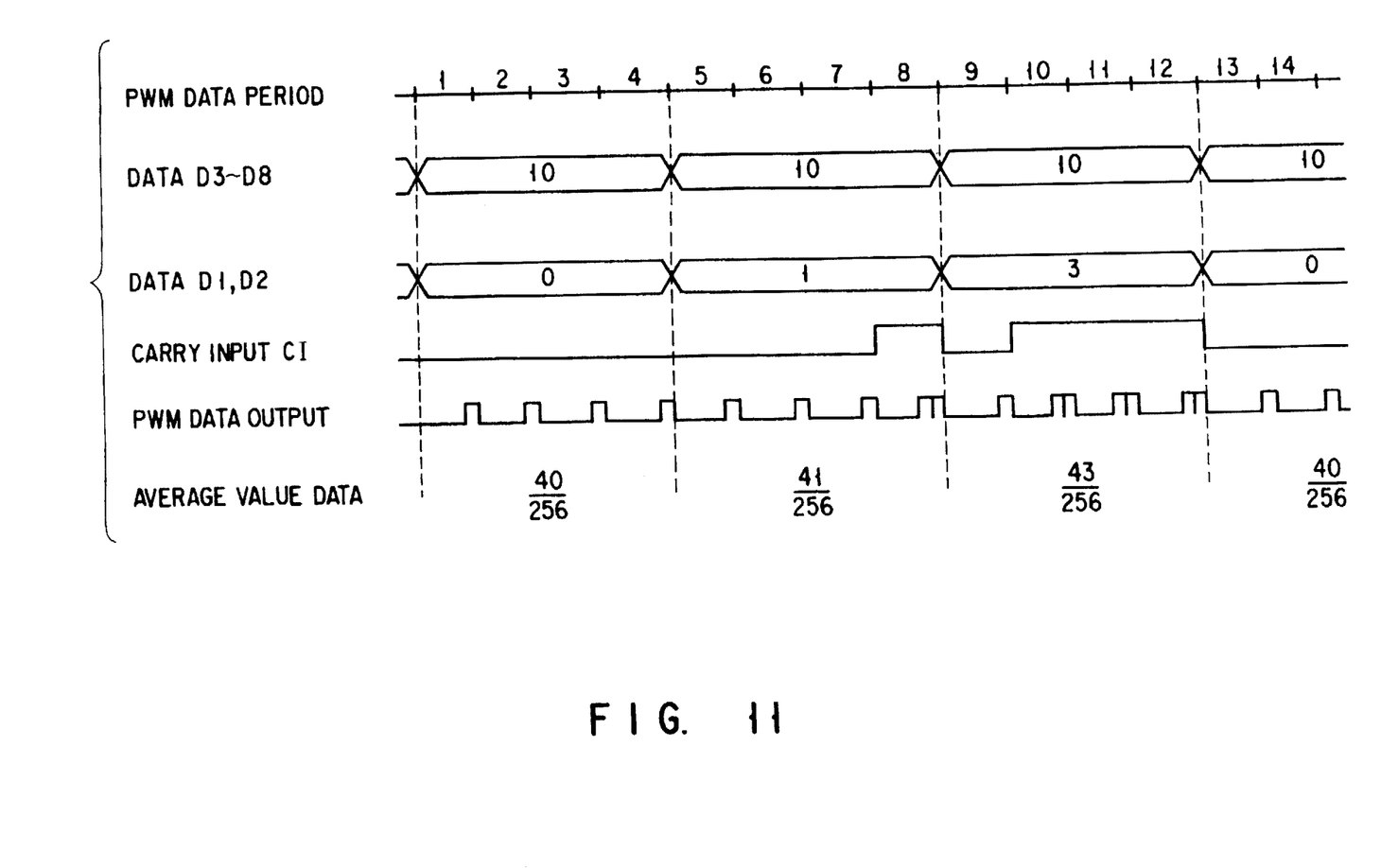
FIG. 11 is a waveform chart showing the operation of the circuit shown in FIG. 10.

FIG. 11 is a waveform chart showing an example of the operation of the circuit shown in FIG. 10.

An average value upon integration for four periods of PWM data output from the 6-bit adder/comparator 942 is calculated.

In PWM periods 1 to 4, if the data value of D3 to D8 is 10 and the data value of D1 and D2 is 0, (10/64)×4 V+4=40/256.

In PWM periods 5 to 8, if the data value of D3 to D8 is 10, and the data value of D1 and D2 changes to 1, the carry input CI of the 6-bit adder/comparator 942 has data "1" in response to the leading edge of PWM period 8, and 1/64 is added to the PWM data of PWM period 8, thus yielding {(10/64)×3+(11/64)}+4=41/256.

In PWM periods 9 to 12, if the data value of D3 to D8 is 10, and the data value of D1 and D2 changes to 3, the carry input CI of the 6-bit adder/comparator 942 has data "1" in response to the leading edge of PWM period 10, and 1/64 is added to the PWM data of PWM periods 10 to 12, thus yielding {(10/64)+(11/64)×3}+4=43/256.

Therefore, according to the circuit shown in FIG. 10, average data can be converted into PWM data whose period is determined in a state wherein 8-bit digital data D1 to D8 are compressed to 6-bit data D3 to D8.

Figure 12:
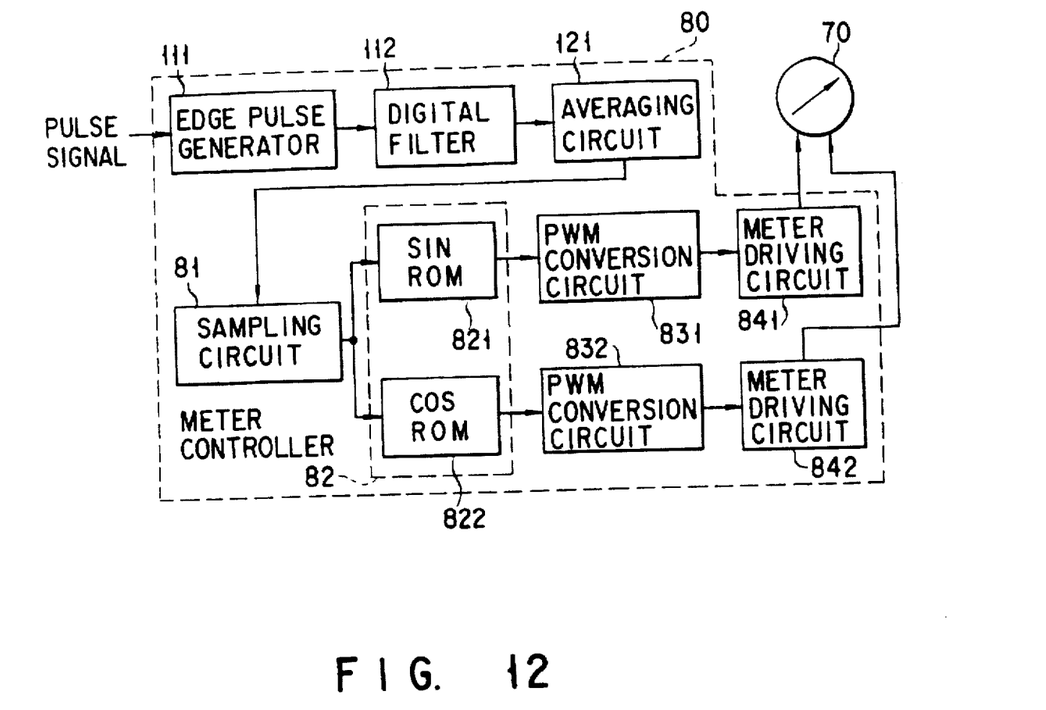
FIG. 12 is a block diagram showing an analog indicator type speedometer apparatus for a vehicle, which uses the F/V converter shown in FIG. 2.

FIG. 12 shows an example of an analog indicator type speedometer apparatus for a vehicle, which uses the above-mentioned F/V converter.

Reference numeral 70 denotes an analog indicator type meter main body; and 80, a meter controller comprising an integrated circuit.

The meter main body 70 is constituted by two electromagnetic coils which are arranged to extend in two orthogonal directions, and a permanent magnet attached to a rotational shaft arranged in a direction perpendicular thereto.

The indication angle of the indicator is determined by rotating the permanent magnet in correspondence with a vector sum of magnetic fields generated by currents which flow through the two electromagnetic coils.

Figure 13:
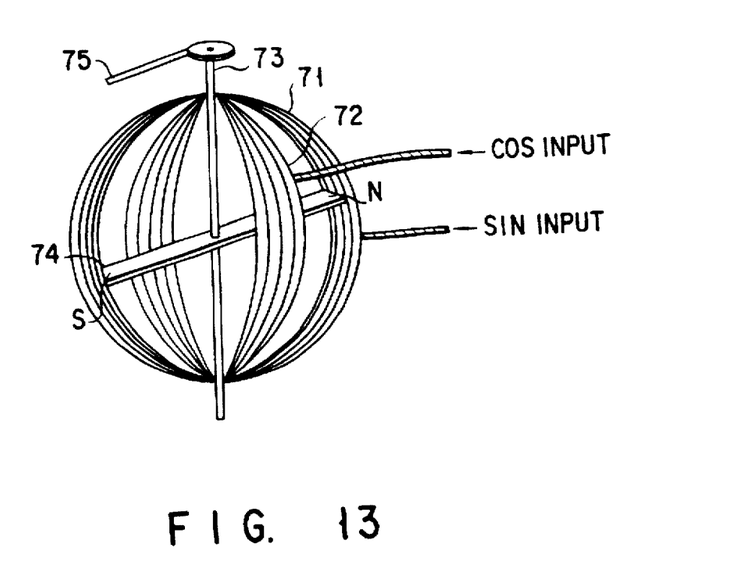
FIG. 13 is a schematic perspective view showing the structure of a meter main body shown in FIG. 12.

FIG. 13 is a schematic perspective view showing the structure of the meter main body 70 shown in FIG. 12.

The analog indicator type meter main body is constituted by electromagnetic coils 71 and 72 wound in correspondence with two bobbins which are arranged in two orthogonal directions, a rotational shaft 73 arranged in a direction perpendicular to these coils, a permanent magnet 74 which is attached to an intermediate portion of the rotational shaft 73 and is arranged in the bobbins, and an indicator 75 which is attached to the distal end portion of the rotational shaft 73 and is arranged outside the bobbins.

Figure 14:
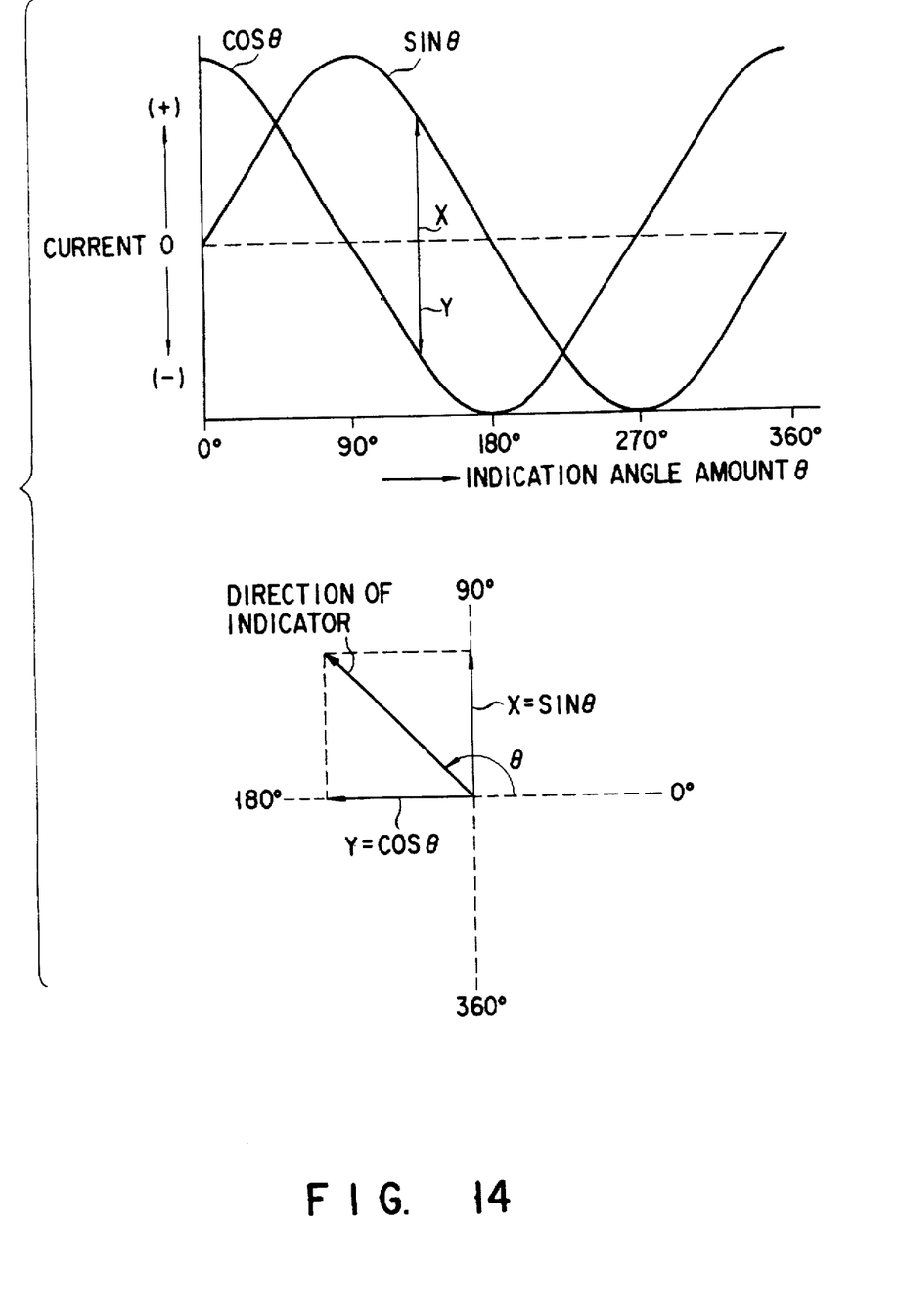
FIG. 14 is a graph showing a state wherein the position of an indicator is controlled by a vector sum of magnetic fields (X, Y) generated by currents (sin θ, cos θ) which flow through two electromagnetic coils of the meter main body shown in FIG. 12.

FIG. 14 shows a state wherein the indication angle of the indicator 75 is determined by controlling the rotation of the permanent magnet 74 in correspondence with a vector sum of magnetic fields (X, Y) generated by currents (sin θ, cos θ) which flow through the two electromagnetic coils 71 and 72 of the meter main body 70.

In the meter controller 80 shown in FIG. 12, a pulse signal having a frequency corresponding to velocity information is input to the edge pulse signal generator 111. A one-shot pulse signal generated by the edge pulse signal generator 111 is processed by the digital filter 112, and is converted into average value data by the averaging circuit 121.

The average value data is sampled by a sampling circuit 81, and thereafter, is converted into triangular function data (sin, cos, and the like) by a triangular function data conversion circuit 82.

The triangular function data conversion circuit 82 comprises, e.g., a sin ROM 821 for storing sin function data, and a cos ROM 822 for storing cos function data. The triangular function data conversion circuit 82 outputs sin and cos function data on the basis of an address input (average value data).

The triangular function data are converted into PWM data by PWM conversion circuits 831 and 832, and these PWM data are converted into currents (or voltages) corresponding to the PWM data by meter driving circuits 841 and 842. The converted currents are supplied to the two electromagnetic coils 71 and 72 of the meter main body 70.

In this case, the relationship between the updating time $T_f$ of average value data obtained by the digital filter 112 and the period $T_{pwm}$ of PWM data converted by the PWM conversion circuits 831 and 832 is set to satisfy $T_f \geq T_{pwm}$.

Therefore, neither a sampling error nor a conversion error occur upon data sampling processing in the sampling circuit 81 or PWM conversion processing in the PWM conversion circuit 831 and 832.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A frequency data converter comprising:
    a digital filter for successively receiving a plurality of one-shot pulses having pulse periods varying in accordance with physical quantity data, and integrating the one-shot pulses to produce digital data, a value of which is updated after each of first updating periods (t) has lapsed;
    an averaging circuit for determining an average value of an n-number of digital data produced by said digital filter in a second updating period ($T_f$) which consists of an n-number of first updating periods (t) (n=natural number), and holding the average value in the second updating period ($T_f$); and
    A PWM conversion circuit for sampling the average value at a predetermined sampling timing in each of sampling periods ($T_{pwm}$), and converting the average value into PWM data,
    wherein the second updating period ($T_f$) and the sampling period ($T_{pwm}$) have the following relationship:

$$T_f \geq T_{pwm};$$

a digital filter output $\Sigma 1_j$ and one shot pulse value $D_j$ have the following relationship:

$$\Sigma 1_j/n = (\Sigma 1_{j-1} - \Sigma 1_{j-1}/n + D_j)/n$$

where $\Sigma 1_{j-1}$ is a digital filter output for previous one shot pulse timing and n is an arbitrary coefficient; and
an averaging circuit output $\bar{x}$ and averaging circuit inputs $\Sigma 2_j/m$, $\Sigma 2_{j-1}/m$, ... $\Sigma 2_{j-k+1}/m$ have the following relationship:

$$\bar{x} = (\Sigma 2_j/m + \Sigma 2_{j-1}/m + \ldots + \Sigma 2_{j-k+1}/m)/k$$

where $\Sigma 2_{j-1}/m$ is an averaging circuit input previous to $\Sigma 2_j/m$ and k is an arbitrary number.

2. A frequency data converter according to claim 1, wherein the physical quantity data is frequency data.

3. A frequency data converter according to claim 2, wherein the frequency data is one of data representing a rotational speed and data representing a velocity.

4. A meter apparatus comprising:

a meter body, having an electromagnetic coil and a permanent magnet, for controlling rotation of the permanent magnet by adjusting an amount of current supplied to the electromagnetic coil, thereby to position an indicator connected to the permanent magnet;

a digital filter for successively receiving a plurality of one-shot pulses having pulse periods varying in accordance with physical quantity data, and integrating the one-shot pulses to digital data, a value of which is updated in a first updating period (t);

an averaging circuit for determining an average value of an n-number of digital data produced by said digital filter in a second updating period ($T_f$) which consists of an n-number of first updating periods (t), and holding the average value in the second updating period ($T_f$); and a PWM conversion circuit for sampling the average value in a predetermined sampling timing in each of sampling periods ($T_{pwm}$), and converting the average value into PWM data;

a meter driving circuit for converting the PWM data into a current value, and supplying current having the current value to the electromagnetic coil, wherein the second updating period ($T_f$) and the sampling period ($T_{pwm}$) have the following relationship:

$$T_f \geq T_{pwm};$$

a digital filter output $\Sigma 1_j$ and one shot pulse value $D_j$ have the following relationship:

$$\Sigma 1_j/n = (\Sigma 1_{j-1} - \Sigma 1_{j-1}/n + D_j)/n$$

where $\Sigma 1_{j-1}$ is a digital filter output for previous one shot pulse timing and n is an arbitrary coefficient; and an averaging circuit output $\bar{x}$ and averaging circuit inputs $\Sigma 2_j/m$, $\Sigma 2_{j-1}/m$, . . . $\Sigma 2_{j-k+1}/m$ have the following relationship:

$$\bar{x} = (\Sigma 2_j/m + \Sigma 2_{j-1}/m + \ldots + \Sigma 2_{j-k+1}/m)/k$$

where $\Sigma 2_{j-1}/m$ is an averaging circuit input previous to $\Sigma 2_j/m$ and k is an arbitrary number.

5. A meter apparatus according to claim 4, wherein the physical quantity data is frequency data.

6. A meter apparatus according to claim 5, wherein the frequency data is one of data representing a rotational speed and data representing a velocity.

7. A meter apparatus according to claim 4, wherein the average value is converted into triangular function data, and the triangular function data is input to the PWM conversion circuit.

* * * * *